United States Patent [19]

Bouchan et al.

[11] Patent Number: 5,564,933
[45] Date of Patent: Oct. 15, 1996

[54] SYSTEM FOR REMOVING ELECTRICAL CHARGES ASSOCIATED WITH MEMORY CARD CONNECTORS

[75] Inventors: Christophe Bouchan, Longjumeau; Frank G. Bordron, Paris; Gilbert S. Saksik, Orgon; Stephen W. Updegraff, Limours, all of France

[73] Assignee: Molex Incorporated, Lisle, Ill.

[21] Appl. No.: 327,731

[22] Filed: Oct. 24, 1994

[30] Foreign Application Priority Data

Oct. 22, 1993 [EP] European Pat. Off. ......... 93 117 134.2

[51] Int. Cl.⁶ .................................................. H01R 9/09
[52] U.S. Cl. .................. 439/76.1; 235/492; 439/60; 439/101
[58] Field of Search ........................... 439/76, 60, 101; 235/492

[56] References Cited

U.S. PATENT DOCUMENTS

| | | | |
|---|---|---|---|
| 4,737,597 | 4/1988 | Tomiya et al. | 174/35 R |
| 4,872,091 | 10/1989 | Maniwa et al. | 439/76 |
| 4,903,402 | 2/1990 | Norton et al. | 29/843 |
| 4,932,888 | 6/1990 | Senor | 439/108 |
| 5,035,631 | 6/1991 | Fiorunneck et al. | 439/108 |
| 5,189,638 | 2/1993 | Kimura | 235/492 |
| 5,210,442 | 5/1993 | Ishimoto | 235/492 |
| 5,244,397 | 9/1993 | Anhalt | 439/101 |
| 5,330,360 | 7/1994 | Marsh et al. | 439/76 |
| 5,398,154 | 3/1995 | Perkins et al. | 439/60 |

FOREIGN PATENT DOCUMENTS

| | | | |
|---|---|---|---|
| 0406610A2 | 2/1991 | European Pat. Off. | G06K 19/06 |
| 2243493 | 4/1993 | United Kingdom | H05K 9/00 |

*Primary Examiner*—P. Austin Bradley
*Assistant Examiner*—Jill DeMello
*Attorney, Agent, or Firm*—Stacey E. Caldwell

[57] ABSTRACT

A system for removing electrical charges from a memory card when the card is electrically coupled to a header connector of an electronic apparatus. The header connector has a plurality of pin terminals mounted therein, including a plurality of pin signal terminals. The memory card includes a circuit substrate, and an elongate receptacle mounted at an edge of the substrate. A plurality of receptacle terminals are mounted within the receptacle, and include receptacle signal terminals which are adapted for electrical connection to corresponding pin signal terminals. A pair of cover plates sandwich the circuit substrate therebetween. At least a portion of one of the cover plates is conductive. The receptacle terminals includes at least one receptacle ground terminal substantially the same length as the other of the receptacle terminals and coupled to the conductive portion of the one cover plate. A pin ground terminal is provided on the header connector of the electronic apparatus and is longer in length than the pin signal terminals. The receptacle ground terminal and the pin ground terminal are therefore adapted for interconnection to remove electrical charges from the memory card prior to interconnection of the receptacle signal terminals and the pin signal terminals.

8 Claims, 4 Drawing Sheets

SYSTEM FOR REMOVING ELECTRICAL CHARGES ASSOCIATED WITH MEMORY CARD CONNECTORS

FIELD OF THE INVENTION

This is invention generally relates to the art of electrical connectors and, particularly, to a system for removing electrical charges stored in a data input device, such as a memory card, when the data input device is connected to an electronic apparatus.

BACKGROUND OF THE INVENTION

Typically, connectors for data input devices, such as memory cards, are electrically connected to an electronic apparatus or storage device, such as a word processor, personal computer or other electronic apparatus. The data stored in the memory card is transferred to the electronic apparatus via the connector. Memory cards are portable instruments and, consequently, electrostatic charges often are generated in the memory cards during handling. When a memory card which is electrostatically charged is inserted into the connector of the electronic apparatus, the charges flow or discharge to the electronic apparatus through the connecting terminals of the connector. This may result in malfunctioning or damage to the underlying electronic apparatus or to the circuit elements on the memory card itself.

Heretofore, in order to protect the memory card and electronic apparatus from such adverse effects of electrostatic discharging, a metal housing of the card is grounded to the apparatus. To facilitate grounding and to provide effective electrostatic discharging protection, memory cards often are equipped with additional features or grounding components, such as grounding clips, grounding Layers within the card itself, or grounding projections within the connector of the electronic apparatus. Such designs typically involve significant additional manufacturing costs associated with the components themselves, as well as costly assembly procedures.

This invention is directed to a very simple system for protecting interconnections between data input devices, such as memory cards, and electronic apparatus from damage by electrostatic discharges, and involving little additional costs to the manufacture of the system.

SUMMARY OF THE INVENTION

An object, therefore, of the invention is to provide a new and improved system for removing electrical charges from a data input device, such as a memory card, when the card is electrically coupled to a header connector of an electronic apparatus.

In the exemplary embodiment of the invention, the header connector of the electronic apparatus has pin terminals, including pin signal terminals, mounted therein. The memory card includes a circuit substrate having conductive circuitry thereon and an elongate receptacle connector mounted along an edge of the substrate. The receptacle connector includes a plurality of receptacle terminals, including receptacle signal terminals, mounted therein, and adapted to electrically connect the circuitry of the circuit substrate to the electronic apparatus by mating to the pin signal terminals. A pair of cover plates sandwich the circuit substrate therebetween.

The invention contemplates that at least a portion of at least one of the cover plates be conductive. The plurality of receptacle terminals includes at least one receptacle ground terminal provided within the receptacle connector and coupled to the conductive portion of the one cover plate and to a grounding circuit on the circuit substrate. The receptacle ground terminal is substantially the same length as the receptacle signal terminals and therefore does not require a seperate stamping die or the assembly of different terminals. At least one corresponding pin ground terminal is provided on the header connector and is longer than the pin signal terminal. The pin ground terminal is coupled to a ground of the electronic apparatus. The receptacle ground terminal and the pin ground terminal are therefore adapted for interconnection to remove electrical charges from the memory card prior to connection of the receptacle signal terminals and the pin signal terminals.

As disclosed herein, the preferred embodiment contemplates that both cover plates of the memory card are substantially entirely conductive, and a receptacle ground terminal is coupled to each cover plate and interconnectable with a respective pin ground terminal on the header connector. Each receptacle ground terminal includes a mating end for mechanically and electrically engaging a pin ground terminal on the header connector, a contacting end for mechanically and electrically engaging one of the conductive cover plates, and an intermediate portion surface mounted to an appropriate ground region on the circuit substrate. At least one receptacle ground terminal is mounted at each opposite end of the elongate receptacle.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
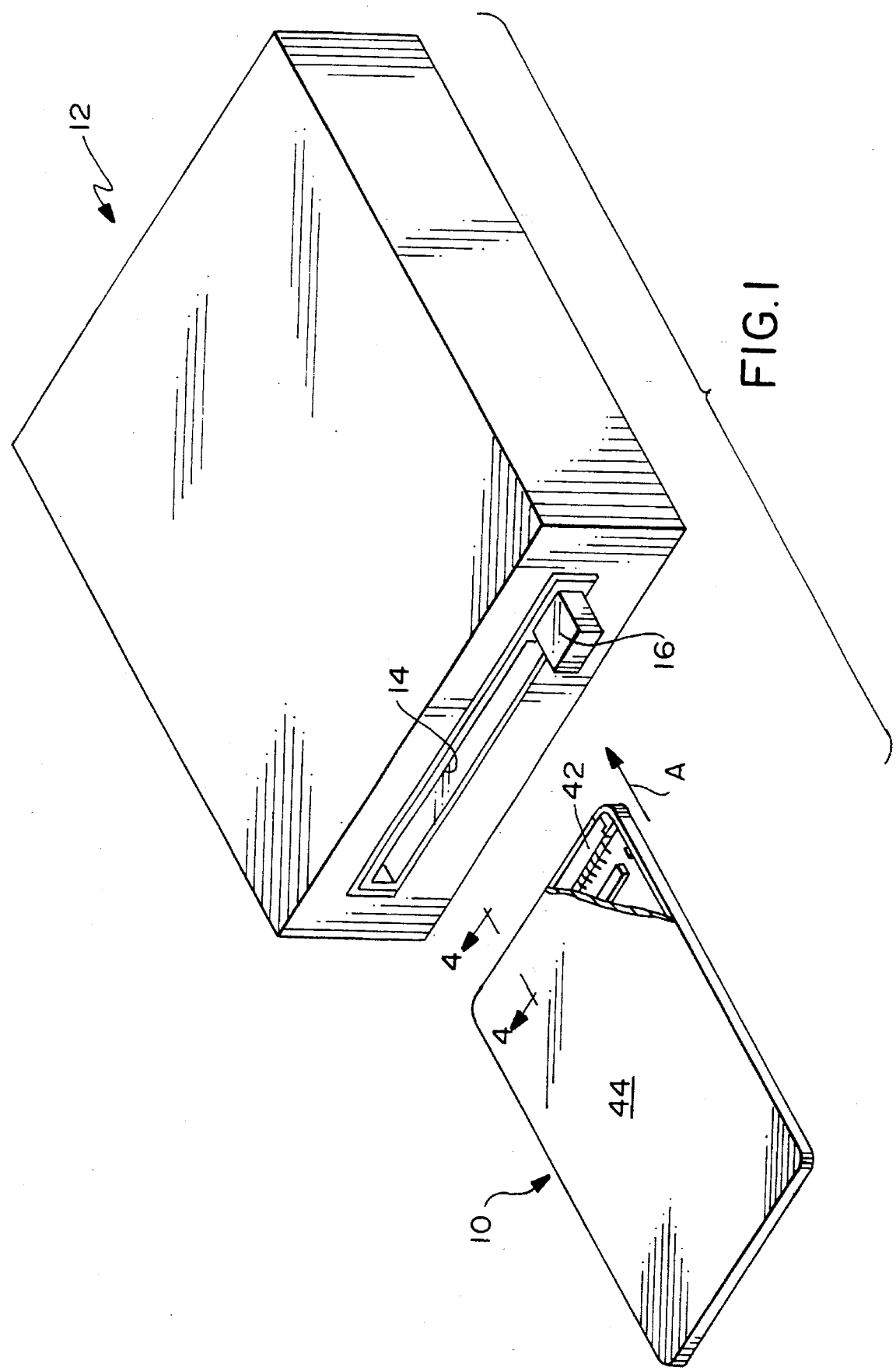
FIG. 1 is a perspective view of a memory card in conjunction with an electrical connector and which may incorporate the system of the invention.

Referring to the drawings in greater detail, and first to FIG. 1, the invention is directed to a system for connecting a data input device such as a memory card, generally designated 10, to an electronic apparatus, generally designated 12. The memory card is inserted into a slot 14 of apparatus 12 in the direction of arrow "A". The card is removed from the apparatus by pushing on an ejector button 16 of an ejector mechanism which is well known in the art, whereupon the card is ejected opposite the direction of arrow "A".

Figure 2:
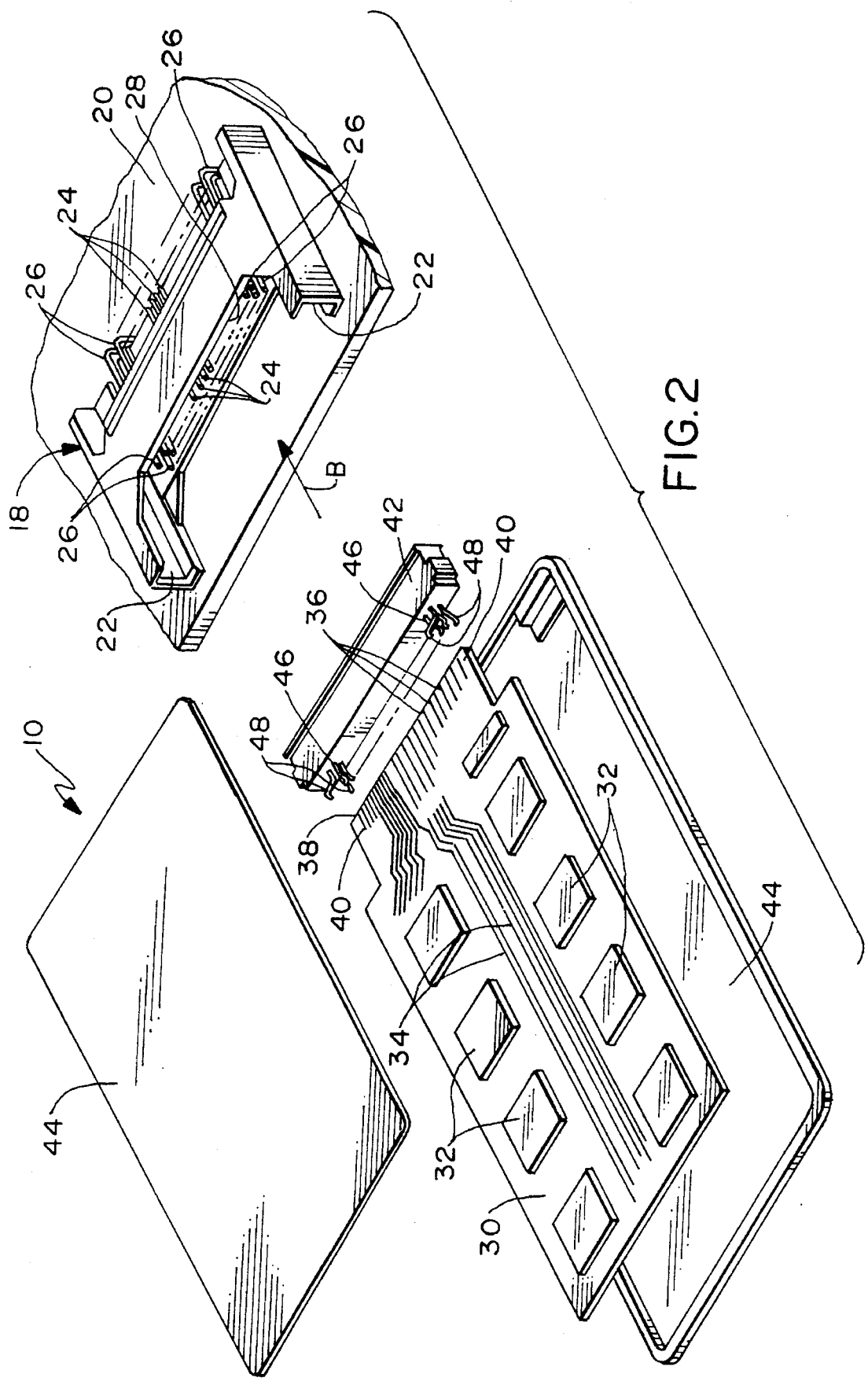
FIG. 2 is an exploded perspective view of the memory card in conjunction with a header connector mounted on a circuit board and incorporating the system of the invention.

Electronic apparatus 12 in FIG. 1 is in the form of a self-contained electrical device for receiving memory card 10. However, FIG. 2 shows the memory card in conjunction with a header connector, generally designated 18, mounted to a printed circuit board 20. The header connector includes a pair of side troughs or channels 22 for receiving the memory card in the direction of arrow "B". As is known in the art, header connector 18 has pin terminals, including pin signal terminals 24, soldered or otherwise fixed to circuit traces on printed circuit board 20 and may be part of such systems as word processors, personal computers or other electronic apparatus. The data stored in memory card 10 is transferred to the electronic apparatus when the memory card is coupled to the header connector. In addition, according to the invention and as described in greater detail hereinafter, the pin terminals include a pair of pin ground terminals 26 at each opposite end of a card-receiving slot 28.

Memory card 10 includes a circuit substrate 30 which includes various circuit elements 32 along with circuit traces 34 leading to contact pads 36 at a leading or front edge 38 of the substrate. This circuitry may be on one or both sides of the substrate, as is known in the art. One of the contact pads is a ground contact pad 40 which is located at each end of edge 38 and on both sides of the circuit substrate. The ground contact pads 40 are connected to appropriate ground regions on the circuit substrate, for purposes to be described in greater detail hereinafter.

Edge 38 of circuit substrate 30 is coupled to an elongate receptacle 42, and this subassembly is sandwiched between a pair of cover plates 44. According to the invention, at least portions of the cover plates, but preferably substantially the entire cover plates, are fabricated of conductive material, such as metal.

Figure 3:
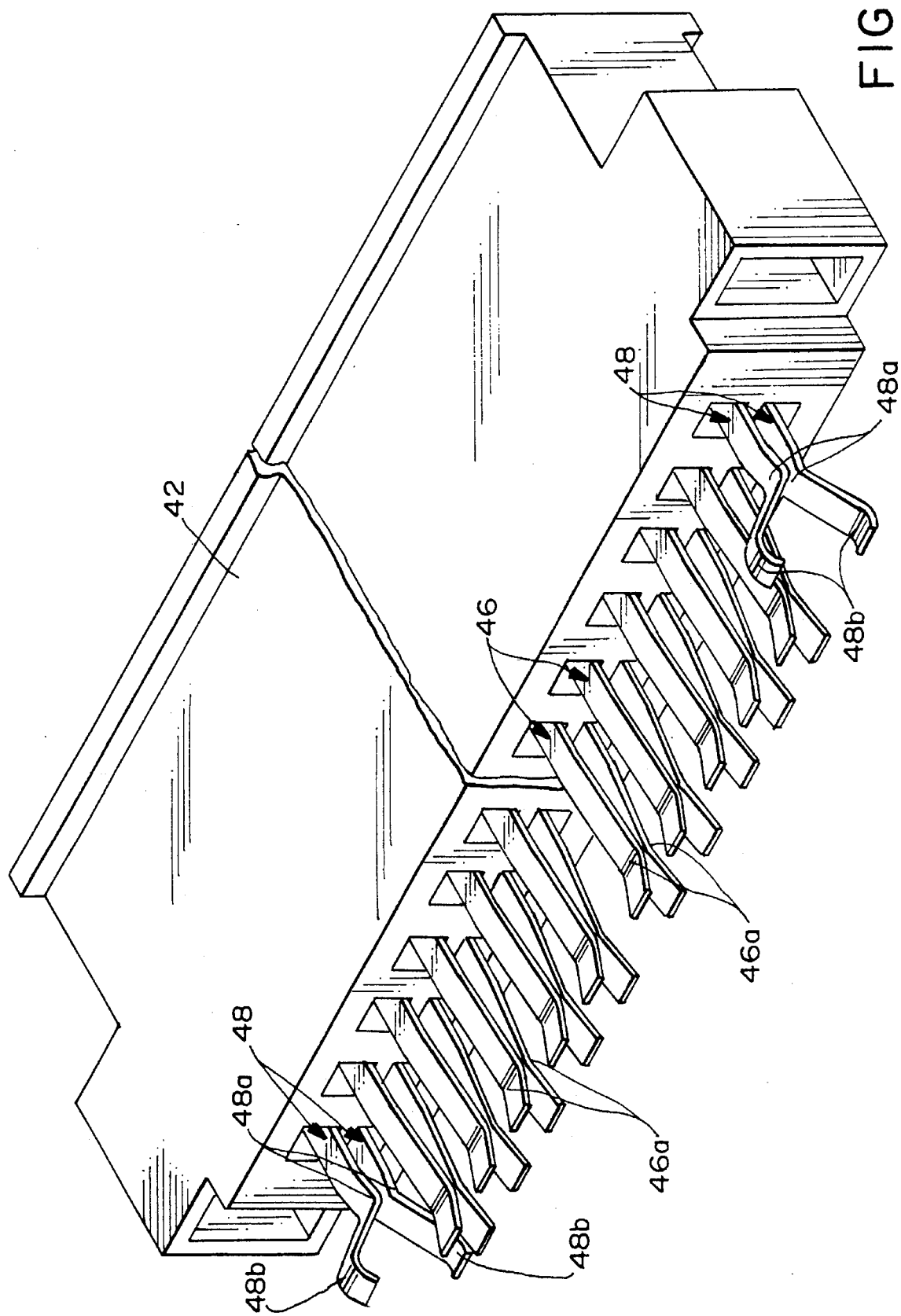
FIG. 3 is a broken perspective view of the receptacle at the mating edge of the memory card.

Referring to FIG. 3 in conjunction with FIG. 2, elongate receptacle 42 mounts a plurality of pairs of receptacle terminals, including a plurality of pairs of input or signal terminals, generally designated 46, along with two pairs of receptacle ground terminals, generally designated 48. It is contemplated that all the receptacle terminals be fabricated or stamped from the same die and therefore the receptacle ground terminals and receptacle signals terminals will have substantially the same length. In this way, cost in assembly and fabrication of the connector can be kept to a minimum. Receptacle signal terminals 46 are best seen in FIG. 3, and each pair of those terminals forms upper and lower contacting ends 46a for mechanically and electrically engaging contact pads 36 on opposite sides of circuit substrate 30. Similarly, each pair of receptacle ground terminals 48 include upper and lower substrate-contacting portions 48a for mechanically and electrically engaging ground contact pads 40 on opposite sides of circuit substrate 30. Therefore, as can be understood from FIG. 3, contacting ends 46a of receptacle signal terminals 46 and substrate-contacting portions 48a of receptacle ground terminals 48 define an elongate mouth therebetween for receiving edge 38 (FIG. 2) of circuit substrate 30, and facilitating the assembly of the substrate to the receptacle. This assembled condition of the circuit substrate is shown best in FIG. 4.

Figure 4:
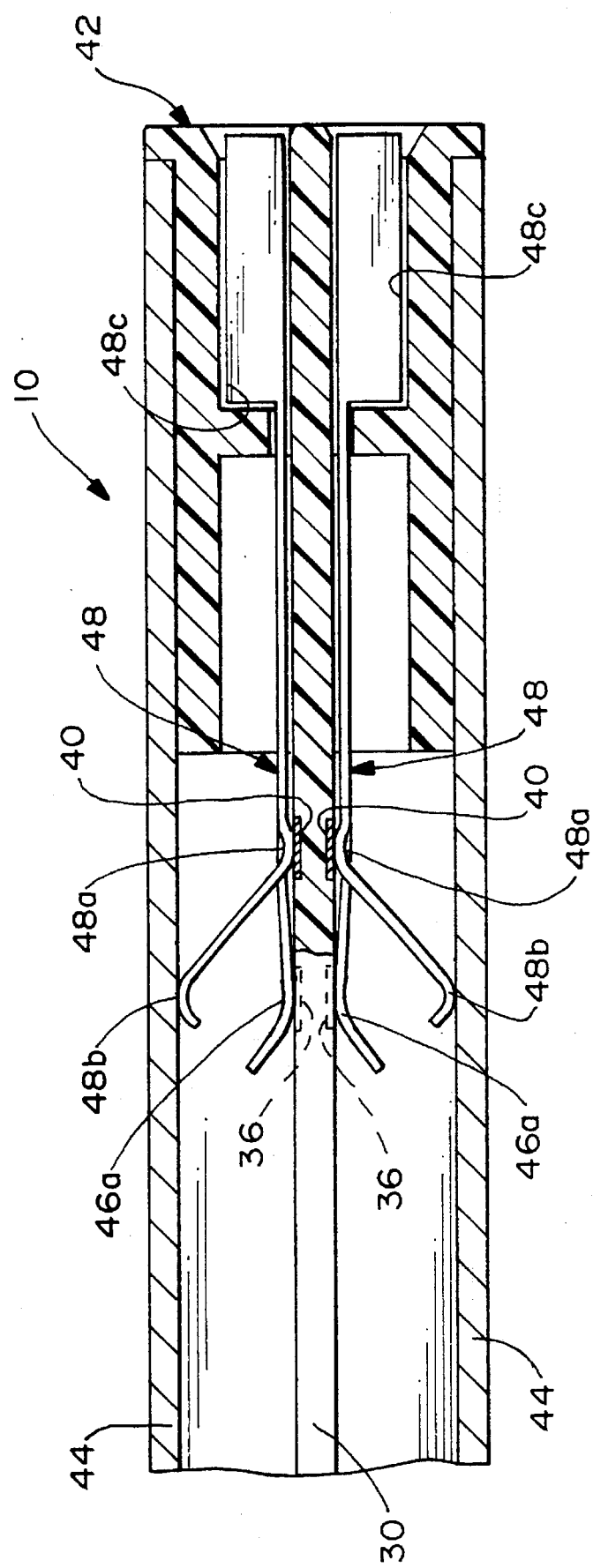
FIG. 4 is a fragmented section, on an enlarged scale, taken generally along line 4—4 of FIG. 1.

Referring now to FIG. 4 in conjunction with FIGS. 2 and 3, as described above with reference to FIG. 3, receptacle ground terminals 48 are shown to include substrate-contacting portions 48a in engagement with ground contact pads 40 on circuit substrate 30. In addition, each receptacle ground terminal 48 includes a cover-contacting end 48b for mechanically and electrically engaging one of the cover plates 44. In FIG. 4, it can be seen that cover-contacting end 48b of the top receptacle ground terminal 48 is in engagement with the inside of the top cover plate 44. Likewise, cover-contacting end 48b of the lower receptacle ground terminal 48 is in contact with the inside of the lower cover plate 44. With the cover plates being fabricated of conductive material, a common ground is established from both the cover plates and from the circuit substrate to the receptacle ground terminals.

Still referring to FIG. 4, receptacle signal terminals 46 and receptacle ground terminals 48 further have mating ends 46c (not shown) and 48c, respectively, for mechanically and electrically engaging pin signal terminals 24 and pin ground terminals 26 (FIG. 2) of header connector 18, the pin ground terminals being electrically coupled to ground circuitry on printed circuit board 20. According to the invention, receptacle ground terminals 48 of memory card 10 and pin ground terminals 26 of header connector 18 are adapted for interconnection to remove electrical charges from the memory card prior to interconnection of receptacle signal terminals 46 of the memory card and pin signal terminals 24 of the header connector. This is accomplished simply by making pin ground terminals 26 of the header connector longer than pin signal terminals 24, to create a first mate/last break contact system.

Therefore, when memory card 10 is inserted into header connector 18, receptacle ground terminals 48 of the memory card and pin ground terminals 26 of the header connector will be coupled first. The electrostatic charges of the memory card will be discharged through the interconnected ground terminals and to an appropriate ground sink of the electronic apparatus, before electrical interconnection of receptacle signal terminals 46 of the memory card and pin signal terminals 24 of the header connector. The circuit elements and integrated circuitry on the circuit substrate, and the electronic apparatus are therefore protected from the electrical charges which have been removed by the very simple system of the invention.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An elongated memory card receptacle connector adapted to connect a circuit substrate to a grounded header connector, and adapted to be assembled within a protective cover member, said receptacle connector including:

a housing having a plurality of receptacle terminals mounted therein, each receptacle terminal having
a mating portion adapted to mechanically and electrically engage a respective pin terminal mounted within the grounded header connector, and
a contact portion adapted to mechanically and electrically engage a conductive region of the circuit substrate, wherein the contact portions of the plurality of receptacle terminals define an elongated mouth for facilitating insertion of the circuit substrate thereinto;

the improvement in the receptacle connector comprising:
a portion of the cover member is conductive, and
one of the plurality of receptacle terminals includes a receptacle grounding terminal having a cover-contacting segment adapted to mechanically and electrically engage the conductive portion of the cover member, wherein the receptacle grounding terminal is substantially the same length as the other of the plurality of receptacle terminals, whereby the circuit substrate and the cover member are commoned by way of the receptacle grounding terminal to provide effective static protection for the memory card.

2. A memory card receptacle connector as set forth in claim 1, wherein said cover member is substantially conductive.

3. A memory card receptacle connector as set forth in claim 2, wherein the plurality of receptacle terminals includes two receptacle grounding terminals, one receptacle grounding terminal being mounted at each opposite end of the elongated receptacle connector.

4. A memory card receptacle connector as set forth in claim 2, wherein said cover member comprises two cover plates, and the plurality of receptacle terminals includes two receptacle grounding terminals each having a cover-contacting segment adapted to mechanically and electrically engage one of the cover plates.

5. A memory card receptacle connector as set forth in claim 4, the two receptacle grounding terminals mounted within the housing in a mirror-image configuration.

6. A memory card including:

a) a circuit substrate;

b) an elongated receptacle mounted on said substrate having a receptacle housing with a plurality of receptacle terminals mounted therein, the receptacle adapted to mate with a grounded header connector having a header housing with a plurality of pins mounted therein adapted to mechanically and electrically engage the plurality of receptacle terminals; and c) a cover member for generally enclosing the substrate and the receptacle;

the improvement comprising:

said cover member having a conductive portion thereon; and one of the receptacle terminals defines a ground terminal electrically and mechanically engaging a ground circuit on said substrate and said conductive area of said cover member, wherein the ground terminal is substantially the same length as the other of the plurality of receptacle terminals, and whereby static electricity generated on the cover member is discharged through the ground terminal to the grounded header connector.

7. A system for removing electrical charges from a memory card when the card is electrically coupled to a header connector of an electronic apparatus which includes a pin signal terminal and a pin ground terminal, the system comprising:

a memory card including a circuit substrate, an elongate receptacle connector mounted along an edge of the circuit substrate, a receptacle signal terminal mounted within the receptacle connector having a first end adapted for electrical connection to the pin signal terminal and having a second end defining an elongate mouth for facilitating insertion of the edge of the circuit substrate thereinto, a cover member enclosing the circuit substrate, and a receptacle ground terminal mounted within the receptacle connector including a mating end for mechanically and electrically engaging the pin ground terminal of the header connector, a cover-contacting portion for mechanically and electrically engaging the conductive cover member, and a substrate-contacting portion coupled to an appropriate ground region on the circuit substrate, wherein the receptacle signal terminal and the receptacle ground terminal are substantially the same length and wherein the pin ground terminal and the receptacle ground terminal are adapted for interconnection to remove electrical charges from the memory card before interconnection of the pin signal terminal and the receptacle signal terminal.

8. The system of claim 7 including a second pin ground terminal and a second receptacle ground terminal, wherein the first pin ground terminal and the first receptacle ground terminal are mounted at a first end of the elongate receptacle, and the second pin ground terminal and the second receptacle ground terminal are mounted at the opposite end of the elongated receptacle.

* * * * *